United States Patent
Kang

(10) Patent No.: US 11,977,103 B2
(45) Date of Patent: May 7, 2024

(54) POWER DEVICE MONITORING SYSTEM AND MONITORING METHOD

(71) Applicant: LS ELECTRIC CO., LTD., Anyang-si (KR)

(72) Inventor: Sunghee Kang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 319 days.

(21) Appl. No.: 17/602,601

(22) PCT Filed: Mar. 25, 2020

(86) PCT No.: PCT/KR2020/004038
§ 371 (c)(1),
(2) Date: Oct. 8, 2021

(87) PCT Pub. No.: WO2020/209526
PCT Pub. Date: Oct. 15, 2020

(65) Prior Publication Data
US 2022/0206046 A1   Jun. 30, 2022

(30) Foreign Application Priority Data
Apr. 10, 2019 (KR) .................. 10-2019-0042103

(51) Int. Cl.
*G01R 19/32*  (2006.01)
*G01R 19/165* (2006.01)
(Continued)

(52) U.S. Cl.
CPC ....... *G01R 19/32* (2013.01); *G01R 19/16571* (2013.01); *G01R 31/2628* (2013.01); *G01R 31/3275* (2013.01)

(58) Field of Classification Search
CPC .............. G01R 19/32; G01R 19/16571; G01R 31/2628; G01R 31/3275; G01R 31/385;
(Continued)

(56) References Cited

U.S. PATENT DOCUMENTS

| 2013/0257177 A1 | 10/2013 | Jacobson |
| 2019/0157904 A1* | 5/2019 | Qian ......................... H02J 3/02 |
| 2019/0173279 A1* | 6/2019 | Haugan ................... H02H 7/28 |

FOREIGN PATENT DOCUMENTS

| CN | 1378717 A | 11/2002 |
| CN | 103528714 A | 1/2014 |

(Continued)

OTHER PUBLICATIONS

International Search Report for related International Application No. PCT/KR2020/004038; report dated Oct. 15, 2020; (5 pages).
(Continued)

*Primary Examiner* — Alexander Satanovsky
*Assistant Examiner* — Trung Q Nguyen
(74) *Attorney, Agent, or Firm* — K&L Gates LLP

(57) ABSTRACT

The present disclosure relates to a monitoring system for a plurality of power devices serially connected in a main circuit of a current transmission path comprising a first power device and a second power device each including a semiconductor element; a first sensor connected to the first and second power devices, and which senses information related to a first current flowing in the first power device; a second sensor for sensing information related to a second current flowing in the second power device; a third sensor for sensing information related to a third current flowing between the first power device and the second power device; and a control unit for comparing the first current and the second current on the basis of the third current measured by the third sensor, and determining whether the state of each
(Continued)

power device is abnormal based on a difference with the third current.

13 Claims, 4 Drawing Sheets

(51) Int. Cl.
*G01R 31/26* (2020.01)
*G01R 31/327* (2006.01)

(58) Field of Classification Search
CPC ........ G01R 31/28; G01R 31/36; G01N 21/47; G01N 21/84; G01N 2291/048; H01M 10/4285; H01M 10/44; H01M 10/48
USPC .......... 324/103 R, 104–111, 76.11, 500, 600, 324/508–511, 764.01
See application file for complete search history.

(56) References Cited

FOREIGN PATENT DOCUMENTS

| CN | 103828031 | A | 5/2014 |
|----|-----------|---|--------|
| EP | 3282584 | A1 | 2/2018 |
| JP | 2005518174 | A | 6/2005 |
| JP | 2006271098 | A | 10/2006 |
| JP | 2007336620 | A | 12/2007 |
| JP | 2010251104 | A | 11/2010 |
| JP | 2011085470 | A | 4/2011 |
| JP | 2019193126 | A | 10/2019 |
| KR | 20150023346 | A | 3/2015 |
| KR | 101531018 | B1 | 6/2015 |
| KR | 101673825 | B1 | 11/2016 |

OTHER PUBLICATIONS

Written Opinion for related International Application No. PCT/KR2020/004038; report dated Oct. 15, 2020; (3 pages).
Office Action for related Japanese Application No. 2021-559928; action dated Jun. 20, 2023; (3 pages).
1 Office Action for related Japanese Application No. 2021-559928; action dated Dec. 20, 2022; (2 pages).
Extended European Search Report for related European Application No. 20786853.0; action dated Nov. 28, 2022; (6 pages).
Notice of Allowance for related Japanese Application No. 2021-559928; action dated Dec. 12, 2023; (3 pages).
Office Action for related Chinese Application No. 202080027586.4; action dated Mar. 1, 2024; (10 pages).

* cited by examiner

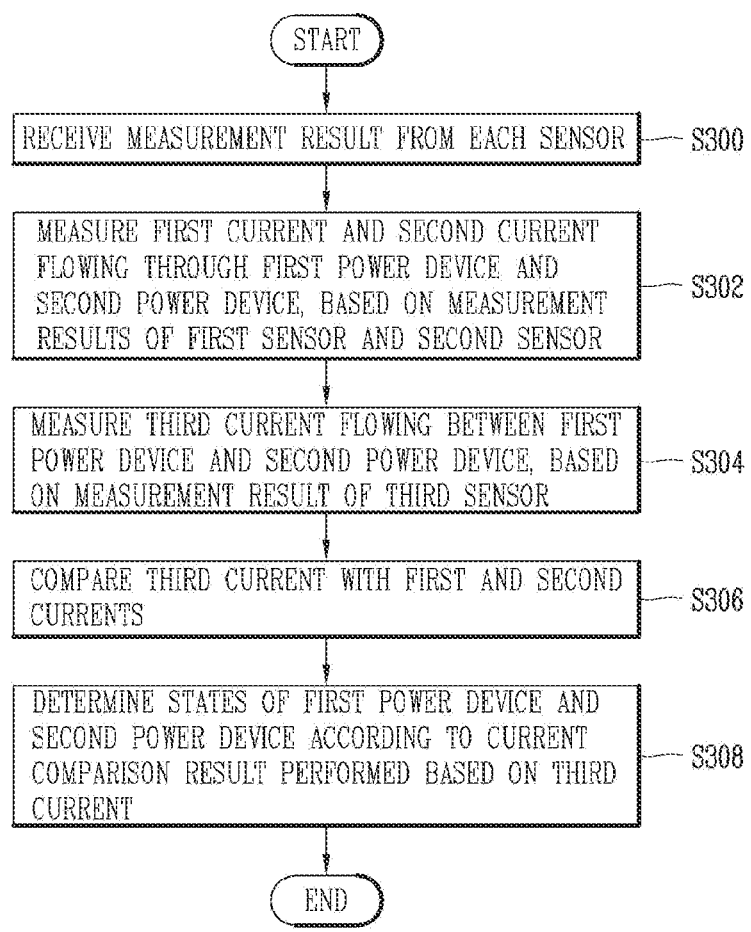

POWER DEVICE MONITORING SYSTEM AND MONITORING METHOD

CROSS-REFERENCE TO RELATED APPLICATIONS

This application is the National Stage filing under 35 U.S.C. 371 of International Application No. PCT/KR2020/004038, filed on Mar. 25, 2020, which claims the benefit of earlier filing date and right of priority to Korea utility model Application No. 10-2019-0042103 filed on Apr. 10, 2019, the contents of which are all hereby incorporated by reference herein in their entirety.

FIELD

The present disclosure relates to a monitoring system for a plurality of power devices serially connected in a main circuit of a current transmission path.

BACKGROUND

In general, in an inverter and a semiconductor-based circuit breaker, power in a power distribution bus is switched through a power switching system in which power devices including semiconductor elements are connected in series in a main circuit of a current transmission path.

FIG. 1 illustrates an example of a configuration of a power switching system in which a plurality of power devices are connected in series.

Referring to FIG. 1, a typical power switching system may include a first terminal 110, a second terminal 112, a first semiconductor element 114, a second semiconductor element 116, diodes 118 and 120 connected to the first semiconductor element 114 and the second semiconductor element 116, and a control unit 126. Here, the first semiconductor element 114 and the second semiconductor element 116 may be respectively connected to the first diode 118 and the second diode 120 to constitute different power devices.

The first semiconductor element 114 and the second semiconductor element 116 may control a flow of current from the first terminal 110 to the second terminal 112 or from the second terminal 112 to the first terminal 110.

The control unit 126 may apply a voltage signal to each of the first semiconductor element 114 and the second semiconductor element 116, to turn on or off the first power device constituted by the first semiconductor element 114 and the second power device 220 constituted by the second semiconductor element 116.

Meanwhile, the power switching system 108 may include a first disconnector 136 electrically connected between the first terminal 110 and a first bus section 104, and a second disconnector 138 electrically connected between the second terminal 112 and a second bus section 106. The disconnectors 136 and 138 may be closed in a normal operation, thereby providing an electrical connection between the individual bus sections and terminals. On the other hand, the disconnectors 136 and 138 may be opened for the purpose of maintenance and the like, and in this case, the power switching system 108 may be disconnected from a power distribution bus 102.

The power switching system 108 may include a current sensor 122 provided between the first disconnector 136 and the first semiconductor element 114 or between the second disconnector 138 and the second semiconductor element 116. Accordingly, the control unit 126 may monitor currents flowing along the first power device and the second power device based on current values measured by the current sensor 122.

On the other hand, in this power switching system, when a fault (abnormal) state is detected from a current measurement result of the current sensor 122, there is not any method to determine whether the detected fault state is caused due to an introduction of an external current or due to damage to a power semiconductor or circuit inside the power switching system. As a result, there is a problem in that it is impossible to accurately determine whether such fault has occurred in the power semiconductor constituting the power device or in an internal circuit of the power switching system.

SUMMARY

The present disclosure is directed to solving aforementioned problems and other drawbacks, and one aspect of the present disclosure is to provide a monitoring system and method, capable of determining a fault for each power device that constitutes a power switching system.

Another aspect of the present disclosure is to provide a monitoring system and method, capable of detecting whether a fault state has occurred due to an introduction of an external current or due to a defect of a power device constituting a power switching system when the fault state is detected in the power switching system.

In order to achieve these and other advantages and in accordance with the purpose of this specification, as embodied and broadly described herein, there is provided a power device monitoring system that may include a first power device and a second power device each including a semiconductor element, a first sensor and a second sensor connected to the first and second power devices, respectively, the first sensor sensing information related to a first current flowing through the first power device and the second sensor sensing information related to a second current flowing through the second power device, a third sensor to sense information related to a third current flowing between the first power device and the second power device, and a control unit to compare the first current and the second current with the third current, and determine a fault state for each power device according to a difference between the first and second currents and the third current.

In one implementation, the first sensor and the second sensor each may further include a temperature sensor. The temperature sensor may measure a temperature of the first power device or the second power device, and current related information regarding a current flowing through the first power device or the second power device and information related to the measured temperature may be transmitted to the control unit.

In one implementation, when the current-related information and the temperature information are received from at least one of the first sensor and the second sensor, the control unit may correct the current-related information based on the temperature information.

In one implementation, the control unit may perform the correction for each power device based on a table modeling a relationship between temperature and current according to a characteristic of each power device, and detect the first current or the second current.

In one implementation, the control unit may perform the correction for each power device based on a table modeling a relationship between temperature and voltage according to a characteristic of each power device, and detect the first current or the second current.

In one implementation, the first power device and the second power device each may be configured as an insulated gate bipolar transistor (IGBT). The first current may be a current flowing between a drain terminal and a source terminal of the first power device, and the second current may be a current between a drain terminal and a source terminal of the second power device.

In one implementation, any one of the first sensor and the second sensor may be a sensor having higher accuracy and reliability than another one.

In order to achieve these and other advantages and in accordance with the purpose of this specification, as embodied and broadly described herein, there is provided a power device monitoring method in a power switching system that may include a first power device and a second power device each including a semiconductor element. The method may include a first step of sensing current-related information regarding a first current flowing through the first power device, a second current flowing through the second power device, and a third current flowing between the first power device and the second power device, a second step of detecting the first current, the second current, and the third current based on the current-related information, a third step of setting the third current as a reference current, a fourth step of comparing the reference current with the first current and the second current, and a fifth step of determining a state of the first power device and a state of the second power device according to a result of the comparison.

In one implementation, the information related to the first current and the information related to the second current may further include a temperature of the first power device and a temperature of the second power device, respectively. The second step may further include a 2-1th step of correcting the information related to the first current according to the temperature of the first power device and the information related to the second current according to the temperature of the second power device.

In one implementation, the 2-1th step may be configured to perform the correction for each power device based on a table modeling a relationship between temperature and current or a table modeling a relationship between temperature and voltage according to a characteristic of each power device.

In one implementation, the fifth step may further include a 5-1th step of determining whether differences between the reference current and the first and second currents are within a preset allowable error range, and a 5-2th step of differently determining, when the differences from the reference current exceed the allowable error range, the state of the first power device corresponding to the first current and the state of the second power device corresponding to the second current, according to whether the first and second currents are greater or smaller than the reference current.

In one implementation, the 5-2th step may be configured to determine, when any one of the first current or the second current is greater than the reference current, that an external current has been introduced into the first power device or the second power device corresponding to the one current.

In one implementation, the fifth step may further include a 5-3th step of determining, when any one of the first current or the second current is smaller than the reference current, that a damage or failure has occurred in the first power device or the second power device corresponding to the one current.

In one implementation, the method may further include a sixth step of determining whether a preset period has expired, and a seventh step of repetitively performing the first step to the fifth step according to whether the preset period has expired.

In one implementation, the first power device and the second power device each may be configured as an insulated gate bipolar transistor (IGBT). The first current may be a current flowing between a drain terminal and a source terminal of the first power device, and the second current may be a current between a drain terminal and a source terminal of the second power device.

According to at least one of implementations of the present disclosure, a current can be measured for each power device constituting a power switching system, thereby determining presence or absence of a fault for each power device.

According to at least one of the implementations of the present disclosure, a current flowing through each power device can be compared with a current flowing between the power devices, thereby determining presence or absence of a fault for each power device.

BRIEF DESCRIPTION OF THE DRAWINGS

FIG. 3 is a flowchart illustrating processes of determining a state of each power device according to a measurement result of each sensor in a power monitoring system in accordance with a first implementation of the present disclosure.

DETAILED DESCRIPTION

It is noted that the technical terms used herein are used only to describe specific implementations and are not intended to limit the invention. A singular representation used herein may include a plural representation unless it represents a definitely different meaning from the context. In this specification, the terms "comprising" and "including" should not be construed to necessarily include all of the elements or steps disclosed herein, and should be construed not to include some of the elements or steps thereof, or should be construed to further include additional elements or steps.

In describing the technology disclosed in this specification, if a detailed explanation for a related known function or construction is considered to unnecessarily divert the gist of the present disclosure, such explanation has been omitted but would be understood by those skilled in the art.

Hereinafter, implementations disclosed herein will be described in detail with reference to the accompanying drawings.

Figure 1:
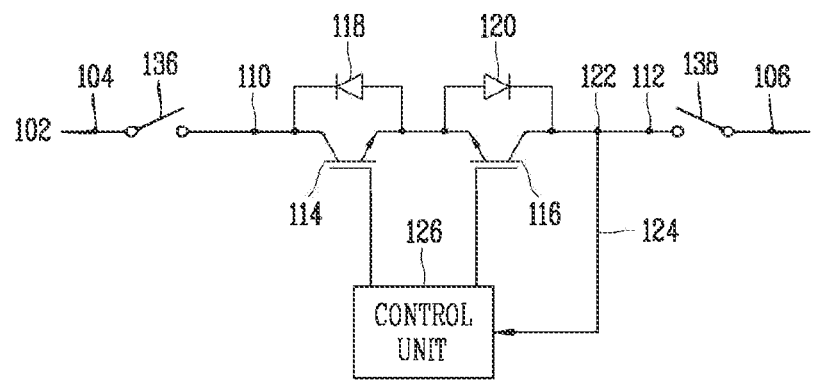
FIG. 1 is an exemplarily view illustrating a configuration of a typical power switching system in which a plurality of power devices are connected in series.
Figure 2:
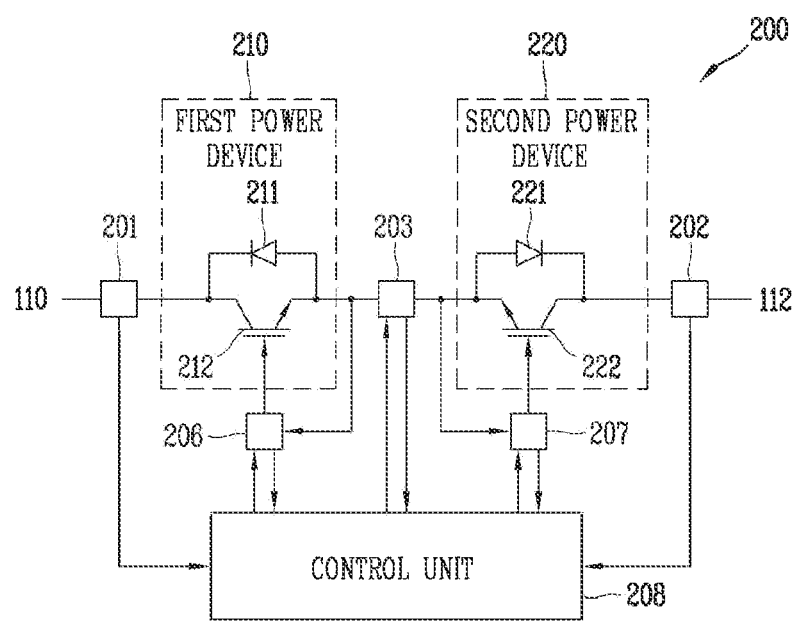
FIG. 2 is a diagram illustrating a configuration of a monitoring system for monitoring a state of each power device in accordance with an implementation of the present disclosure, in a power switching system.

FIG. 2 is a diagram illustrating a configuration of a monitoring system for monitoring a state of each power device 200 in accordance with an implementation of the present disclosure, in a power switching system.

Referring to FIG. 2, a power device monitoring system 200 according to an implementation of the present disclosure may include a first power device 210, a second power device 220, a first sensor 201 for sensing a current flowing through the first power device 210, a second sensor 202 for sensing a current flowing through the second power device 220, a third sensor 203 for sensing a current flowing between the first power device 210 and the second power device 220, a first driving unit 206 for controlling ON or OFF of the first power device 210, a second driving unit 207 for controlling ON or OFF of the second power device 220, and a control unit 208 for controlling the operations of the first driving unit 206 and the second driving unit 207.

First, the first power device 210 may include a first semiconductor element 212 and a first diode 211. Here, the first semiconductor element 212 may be configured as an insulated gate bipolar transistor (IGBT).

The first power device 210 may be turned on (ON state) when a preset voltage is applied by the first driving unit 206. In the ON state, a current may flow through the first semiconductor element 212. On the other hand, the first power device 210 may be turned off when the preset voltage is not applied by the first driving unit 206. In the OFF state, a current may flow through the first diode 211.

Similarly, the second power device 220 may include a second semiconductor element 222 and a second diode 221. Here, the second semiconductor element 222 may be configured as an insulated gate bipolar transistor (IGBT).

The second power device 220 may be turned on (ON state) when a preset voltage is applied by the second driving unit 207. In the ON state, a current may flow through the second semiconductor element 222. On the other hand, the second power device 210 may be turned off when the preset voltage is not applied by the second driving unit 207. In the OFF state, a current may flow through the second diode 221.

Meanwhile, the first sensor 201 may be a sensor for directly or indirectly measuring a current flowing through the first power device 210. For example, the first sensor 201 may be a sensor (e.g., a hall sensor) that is directly connected to the first power device 210 to directly measure a first current flowing through the first power device 210. Alternatively, the first sensor may be a voltage sensor that includes a preset resistance for indirectly measuring the first current.

Here, a voltage measured by the first sensor 201 may be a voltage (i.e., Voltage drain to source (VDS)) between a drain terminal and a source terminal in the first semiconductor element 212 of the first power device 210. In this case, the first current may be a current that flows between the drain terminal and the source terminal in the first semiconductor element 212.

Similarly, the second sensor 202 may be a sensor for directly or indirectly measuring a current flowing through the second power device 220. For example, the second sensor 202 may be a current sensor that directly measure a second current flowing through the second power device 220, or a voltage sensor that includes a preset resistance for indirectly measuring the first current.

Here, a voltage measured by the second sensor 202 may be a voltage (i.e., Voltage drain to source (VDS)) between a drain terminal and a source terminal in the second semiconductor element 222 of the second power device 220. In this case, the second current may be a current that flows between the drain terminal and the source terminal in the second semiconductor element 222.

The third sensor 203 may be a sensor for directly or indirectly measuring a current flowing between the first power device 210 and the second power device 220. For example, the third sensor 203 may be disposed on a connection wire for connecting the first power device 210 and the second power device 220, and may be a sensor for directly measuring a current flowing through the connection wire or a voltage sensor including a preset resistance.

Meanwhile, the first driving unit 206 and the second driving unit 207 may apply a preset driving voltage to at least one of the first power device 210 and the second power device 220 under the control of the control unit 208. In this case, a different driving voltage may be applied to the first power device 210 or the second power device 220.

The control unit 208 may measure the first current flowing through the first power device 210 and the second current flowing through the second power device 220 based on measurement results of the first sensor 201 and the second sensor 202.

For example, when the first sensor 201 and the second sensor 202 are current sensors, the control unit 208 may determine the first current flowing through the first power device 210 and the second current flowing through the second power device 220 based the measurement result of the first sensor 201 and the measurement result of the second sensor 202.

However, when the first sensor 201 and the second sensor 202 are voltage sensors, the control unit 208 may detect the first current and the second current based on a current-voltage table modeling a current-voltage relationship according to a characteristic of each power device.

In addition, the control unit 208 may measure a third current flowing between the first power device 210 and the second power device 220 based on a measurement value of the third sensor 203. In this case, when the third sensor 203 is a current sensor, the control unit 208 may directly detect the third current flowing between the first power device 210 and the second power device 220 based on the current value measured by the third sensor 203. However, when the third sensor 203 is a voltage sensor, the third current may be detected based on a table modeling a voltage-current relationship according to a preset resistance.

Then, the control unit 208 may set the third current as a reference current. In addition, the set reference current may be compared with the first and second currents. As a result of the comparison, when there is a current, of the first current or the second current, having a difference from the third current which is out of a preset allowable error range, the control unit 208 may determine that a fault has occurred. In this case, the control unit 208 may detect a power device with the fault based on the current out of the allowable error range.

In this case, when a difference between the first current and the reference current exceeds the allowable error range, the control unit 208 may detect that a fault has occurred in the first power device 210. On the other hand, when a difference between the second current and the reference current exceeds the allowable error range, the control unit 208 may detect that a fault has occurred in the second power device 220.

In more detail, when the first current or the second current is greater than the reference current (third current) and the difference from the reference current exceeds the allowable error range, the control unit 208 may determine that there is another current flowing into the first power device or the second power device 220. That is, the control unit 208 may determine that an external current such as a leakage current flows into the first power device 210 or the second power device 220.

On the other hand, when the first current or the second current is smaller than the reference current (third current) and the difference from the reference current exceeds the allowable error range, the control unit 208 may determine that a defect or damage has occurred in the first power device or the second power device 220.

Meanwhile, since the first sensor 201 and the second sensor 202 are respectively connected to the power devices, errors may occur due to heat generated by the connected power devices.

In order to prevent such error caused by a temperature difference, the control unit 208 may correct (compensate for) the error based on a preset temperature-current table or a temperature-voltage table. To this end, the first sensor 201 and the second sensor 202 each may further include a temperature sensor, and may transmit current values or voltage values measured from the respective power devices and temperature values measured by the temperature sensors to the control unit 208 when the first current and the second current are sensed.

Also, for each power device, the control unit 208 may include a table modeling a relationship between temperature and current according to a characteristic of each power device or a table modeling a relationship between temperature and voltage according to a characteristic of each power device. Further, the control unit may correct information (current value or voltage value) measured by the first sensor 201 and information (current value or voltage value) measured by the second sensor 202 based on the provided modeling table.

On the other hand, the first sensor 201 and the second sensor 202 may be connected to the first power device 210 and the second power device 220, respectively, while the third sensor 203 may be provided on the connection wire connecting the first power device 210 and the second power device 220.

Accordingly, heat generated from the first power device 210 and the second power device 220 may be directly transferred to the first sensor 201 and the second sensor 202 and errors caused due to the heat may be included in the measured results of the first sensor 201 and the second sensor 202. On the other hand, heat of each power device may not be transferred to the third sensor 203 and thus an error caused due to the heat (i.e., temperature error) may be smaller than those in the first sensor 201 and the second sensor 202.

Accordingly, the third sensor 203 can measure a more accurate current than the first sensor 201 and the second sensor 202. Therefore, the control unit 208 can set the third current measured by the third sensor 203 as a reference current value.

FIG. 3 is a flowchart illustrating processes of determining a state of each power device according to a measurement result of each sensor in a power monitoring system in accordance with a first implementation of the present disclosure.

Referring to FIG. 3, the control unit 208 of the power monitoring system according to an implementation of the present disclosure may first receive measurement results from the first sensor 201, the second sensor 202, and the third sensor 203, respectively (S300). Here, the first sensor 201 to the third sensor 203 may be voltage sensors each including a preset voltage, or current sensors that directly sense current values.

When measurement results of the respective sensors are obtained, the control unit 208 may measure a first current flowing through the first power device 210 and a second current flowing through the second power device based on the measurement results of the first sensor 201 and the second sensor 202 (S302). In this case, when the first sensor 201 and the second sensor 202 are voltage sensors, the first current and the second current may be measured by a voltage-current table modeling a voltage change with respect to a current according to a characteristic of each power device. On the other hand, when the first sensor 201 and the second sensor 202 are temperature sensors, the first current and the second current may be measured by a temperature-current table modeling a temperature change with respect to a current according to the characteristic of each power device.

Meanwhile, each of the first sensor 201 and the second sensor 202 may further include a temperature sensor. In this case, the first sensor 201 and the second sensor 202 may further transmit temperature values sensed through the temperature sensors when the current values or voltage values of the first power device 210 and the second power device 220 are sensed. The control unit 208 may then compensate for (correct) information (current value or voltage value) sensed by the first sensor 201 and information (current value or voltage value) sensed by the second sensor 202, based on the transmitted temperature values of the first power device 210 and the second power device 220.

The control unit 208 may measure a third current flowing between the first power device 210 and the second power device 220 based on a measurement result of the third sensor 203 (S304). In this case, when the third sensor 203 is a current sensor, the third current may be directly measured based on the measured value. However, when the third sensor 203 is a voltage sensor, the third current may be detected based on a voltage-current table according to a preset voltage.

When the third current is detected, the control unit 208 may compare the first current and the second current with the detected third current (S306). In the step S306, the control unit 208 may determine whether the first current or the second current is large or small than a reference current, that is, the third current, and detect whether a difference between the third current and the first current or the second current is within a preset allowable error range.

The control unit 208 may determine states of the first power device 210 and the second power device 220, respectively, according to a result of the comparison of the step S306 (S308).

For example, when the first current is greater than the third current and a difference between the currents exceeds the preset allowable error range, the control unit 208 may determine that an external current has been introduced into the first power device 210. Alternatively, when the first current is smaller than the third current and a difference between the currents exceeds the preset allowable error range, the control unit 208 may determine that the first power device 210 has been deteriorated due to damage or failure.

Also, when the second current is greater than the third current and a difference between the currents exceeds the preset allowable error range, the control unit 208 may determine that an external current has been introduced into the second power device 220. Alternatively, when the second current is smaller than the third current and a difference between the currents exceeds the preset allowable error range, the control unit 208 may determine that the second power device 220 has been deteriorated due to damage or failure.

That is, when the difference between the reference current (third current) and the first current or the second current exceeds the allowable error range, the control unit 208 may determine the states of the first power device and the second power device differently according to whether the first current or the second current is smaller or larger than the reference current. Also, the control unit 208 may determine the states of the first power device and the second power device individually.

On the other hand, assuming that each power device has the same performance, when the same current continuously flows, the two power devices may exhibit characteristics according to a flowing direction of the current. Each power device may have a specific characteristic value depending on a current flowing in a forward or reverse direction. In this case, the characteristic of the power device over a specific range may be expressed as a ratio of V/I, and if a current flowing even in any one of the forward direction and the reverse direction exceeds the range or ratio of the characteristic value, it may be determined that the power device has been damaged.

In addition, when it is determined that the power device has been damaged, the control unit 208 may immediately notify it to an upper system and stop the operation of each power device. In this case, in order to stop the operation, the control unit 208 may set the order of stopping the operation of each component (e.g., each power device) in consideration of system stability.

Meanwhile, the steps of FIG. 3 may be performed during an initial check process for an initial system operation. In addition, the control unit 208 may monitor (check) the states of the power devices through a continuous operation check repetitively at a preset period during the operation of the system, and determine the states of the respective power devices. Accordingly, reliability of the system can be improved.

Figure 4A:
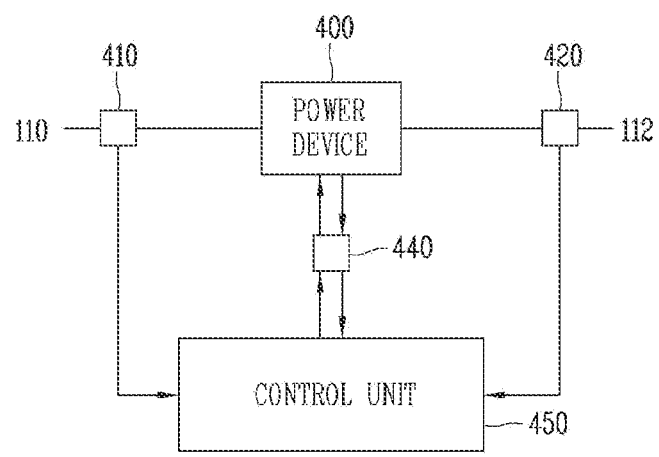
FIG. 4A and FIG. 4B are diagrams illustrating configurations of a power device monitoring system in accordance with a second implementation of the present disclosure.
Figure 4B:
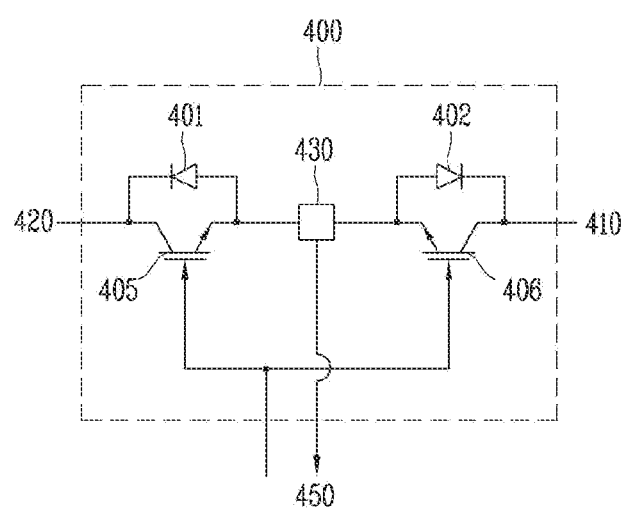

On the other hand, FIG. 4A and FIG. 4B are diagrams illustrating configurations of a power device monitoring system in accordance with a second implementation of the present disclosure.

First, referring to FIG. 4A, a power device 400 may be an integrated power device that can perform bidirectional control of currents according to a flow of current, namely, can control a current flowing in a forward direction and a current flowing in a reverse direction. In this case, the power device 400 may be turned on or off by a single driving unit 440. The driving unit 440 may apply voltages to a first semiconductor element 405 and a second semiconductor element 406, respectively, to operate the first semiconductor element 405 and the second semiconductor element 406 under the control of the control unit 450.

Meanwhile, the power device 400, as illustrated in FIG. 4B, may include two semiconductor elements 405 and 406 and two diodes 401 and 402.

In this case, a first sensor 410 and a second sensor 420 may sense information (current value or voltage value) related to a first current flowing through the first semiconductor element 405 and information (current value or voltage value) related to a second current flowing through the second semiconductor element 406. In more detail, the first sensor 410 may sense information related to a current (first current) flowing between a drain terminal and a source terminal of the first semiconductor element 405, and the second sensor 420 may sense information related to a current (second current) flowing between a drain terminal and a source terminal of the second semiconductor element 406.

In addition, the power device monitoring system may further include a third sensor 430 that is disposed between the first semiconductor element 405 and the second semiconductor element 406 to sense information (voltage value or current value) related to a current flowing between the first semiconductor element 405 and the second semiconductor element 406.

Meanwhile, information measured by the first sensor 410 and the second sensor 420 may be transmitted to the control unit 450. In addition, information measured by the third sensor 430 may be transmitted to the control unit 450 through the driving unit 440. Then, the control unit 450 may detect the first current, the second current, and the third current based on the information measured by each of the first sensor 410 to the third sensor 430, and determine whether or not a fault has occurred in the power device 400 based on a comparison result between the third current as a reference current and the first and second currents.

In more detail, the control unit 450 may also detect a semiconductor element, in which a fault has occurred of the semiconductor elements constituting the power device 400, according to a result of the comparison between the third current and the first and second currents.

Meanwhile, any one of the first sensor 410 and the second sensor 420 may be implemented as a more precise and more reliable sensor than the other. In this case, a current or voltage flowing through the power device 400 may be measured and a direction of the current may be predicted through the more precise and more reliable sensor, and the measured and predicted results may be compared with a measurement result of the other sensor, thereby monitoring stability of the power device 400.

Figure 5:
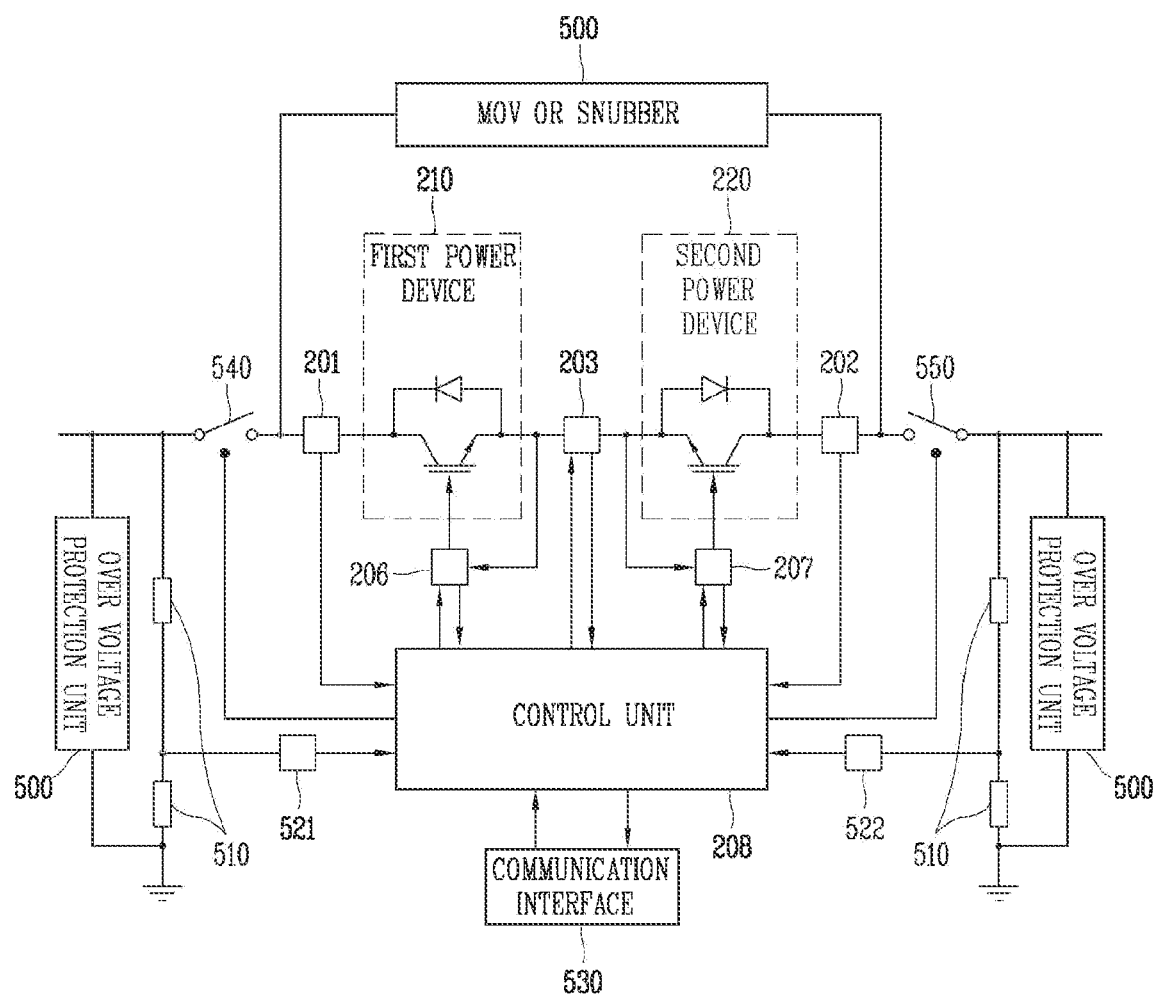
FIG. 5 is a diagram illustrating a configuration of a power device monitoring system in accordance with a third implementation of the present disclosure.

Meanwhile, the power device monitoring system according to the implementation of the present disclosure may further include at least one overvoltage protection unit. FIG. 5 is a diagram illustrating a configuration of a power device monitoring system in accordance with a third implementation of the present disclosure.

Referring to FIG. 5, the present disclosure may further include overvoltage protection units 500 for protecting power devices 210 and 220 from overvoltage. The overvoltage protection units 500 each may include at least one of a metal oxide varistor (MOV) and a snubber.

Meanwhile, the overvoltage protection unit 500 may be disposed at both ends with respect to the power devices 210 and 220. In addition, resistors 510 and voltage sensors 521 and 522 may be connected in series at the both ends with respect to the power devices 210 and 220.

In this case, the serially-connected resistors and voltage sensors 521 and 522 may measure voltages of currents input to the respective power devices 210 and 220. Each of the voltage sensors 521 and 522 may include an insulating interface and an analog digital converter (ADC) for measuring an analog voltage as a digital value. The insulating interface may prevent the voltages measured by the voltage sensors 521 and 522 from being applied to the control unit 208.

A communication interface 530 may be further provided, and an external input may be applied to the control unit 208 through the communication interface 530. Also, the control unit 208 may exchange information with other external devices through the communication interface 530.

Meanwhile, the foregoing description of the present disclosure has been given of the detailed implementations, but various modifications may be made without departing from the scope of the present disclosure. In particular, although the configuration in which each power device includes a diode has been described in the foregoing implementations, it goes without saying that a diode may not be included depending on type and characteristic of a power device.

In addition, the present disclosure described above can be applied to a semiconductor circuit breaker for power. The foregoing description has been given of an example in which each power device has a configuration including a semiconductor element implemented as an insulated gate bipolar transistor (IGBT), but the present disclosure may, of course, be applied even to a case including other types of semiconductor elements. As an example, the present disclosure can also be applied to other power semiconductor devices or power devices such as SiC or GaN devices.

The present disclosure can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the control unit 208. Therefore, the detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

The invention claimed is:

1. A power device monitoring system comprising:
a first power device and a second power device each including a semiconductor element;
a first sensor and a second sensor connected to the first and second power devices, respectively, the first sensor sensing information related to a first current flowing through the first power device and the second sensor sensing information related to a second current flowing through the second power device;
a third sensor to sense information related to a third current flowing between the first power device and the second power device; and
a control unit configured to:
compare the first current and the second current with the third current,
determine that the first power device and the second power device have no abnormalities when the first current and the second current are each equal to the third current,
determine whether differences between the third current and the first current, and third current and the second current, are within a preset allowable error range when either the first current or the second current is different from the third current; and
differently determine when the differences from the third current exceed the allowable error range, a state of the first power device corresponding to the first current and a state of the second power device corresponding to the second current according to whether the first current and the second current are greater or smaller than the third current.

2. The system of claim 1, wherein the first sensor and the second sensor each further comprises a temperature sensor, and
wherein the temperature sensor measures a temperature information of the first power device or the second power device, and current-related information regarding a current flowing through the first power device or the second power device and information related to the measured temperature information are transmitted to the control unit.

3. The system of claim 2, wherein the control unit, when the current-related information and the temperature information are received from at least one of the first sensor and the second sensor, corrects the current-related information based on the temperature information.

4. The system of claim 3, wherein the control unit corrects the current-related information for each power device based on a table modeling a relationship between temperature and current according to a characteristic of each power device, and detects the first current or the second current.

5. The system of claim 3, wherein the control unit corrects the current-related information for each power device based on a table modeling a relationship between temperature and voltage according to a characteristic of each power device, and detects the first current or the second current.

6. The system of claim 1, wherein the first power device and the second power device are each configured as an insulated gate bipolar transistor (IGBT),
wherein the first current is a current flowing between a drain terminal and a source terminal of the first power device, and
wherein the second current is a current between a drain terminal and a source terminal of the second power device.

7. A power device monitoring method in a power switching system comprising a first power device and a second power device each including a semiconductor element by a control unit of the power switching system, the method comprising:
controlling a first sensor connected to the first power device and a second sensor connected to the second power device by the control unit to sense current-related information regarding a first current flowing through the first power device, a second current flowing through the second power device, and
controlling a third sensor disposed between the first power device and the second power device by the control unit to sense a third current flowing between the first power device and the second power device;
detecting, by the control unit, the first current, the second current, and the third current based on the current-related information;
comparing, by the control unit, the third current with the first current and the second current;
determining, by the control unit, that the first power device and the second power device have no abnormalities when the first current and the second current are each equal to the third current;
determining, by the control unit, whether differences between the third current and the first current and the second current are within a preset allowable error range when either the first current or the second current is different from the third current;
differently determining, by the control unit, when the differences from the third current exceed the allowable error range, an abnormal state of the first power device corresponding to the first current and an abnormal state of the second power device corresponding to the second current according to whether the first current and the second current are greater or smaller than the third current;

notifying, by the control unit, the determined abnormal state of the first power device or the second power device to a preset system, when the abnormal state of the first power device or the second power device is determined; and stopping, by the preset system, operation of at least one of the first power device in response to determining the abnormal state of the first power device and the second power device in response to determining the abnormal state of the second power device, respectively.

8. The method of claim 7, wherein the information related to the first current and the information related to the second current further include a temperature of the first power device and a temperature of the second power device, respectively, wherein detecting, by the control unit, the first current, the second current, and the third current further comprises correcting the information related to the first current according to the temperature of the first power device and the information related to the second current according to the temperature of the second power device.

9. The method of claim 8, wherein correcting, by the control unit, the information related to the first current and the information related to the second current is configured to perform the correction for each power device based on a table modeling a relationship between temperature and current or a table modeling a relationship between temperature and voltage according to a characteristic of each power device.

10. The method of claim 7, wherein differently determining the abnormal state of the first power device and the abnormal state of the second power device by the control unit includes determining, when any one of the first current or the second current is greater than the third current, that an external current has been introduced into the first power device or the second power device corresponding to the one current.

11. The method of claim 7, wherein determining the abnormal state of the first power device and the abnormal state of the second power device by the control unit further comprises determining, when any one of the first current or the second current is smaller than the third current, that a damage or failure has occurred in the first power device or the second power device corresponding to the one current.

12. The method of claim 7, further comprising:
determining, by the control unit, whether a preset period has expired; and
continuing to monitor, by the control unit, the first power device and the second power device until the preset period expires.

13. The method of claim 7, wherein the first power device and the second power device are each configured as an insulated gate bipolar transistor (IGBT), wherein the first current is a current flowing between a drain terminal and a source terminal of the first power device, and wherein the second current is a current between a drain terminal and a source terminal of the second power device.

* * * * *